United States Patent
Mullen et al.

(10) Patent No.: US 7,119,360 B2
(45) Date of Patent: Oct. 10, 2006

(54) LIGHT-EMITTING POLYMERS AND ELECTRONIC DEVICES USING SUCH POLYMERS

(75) Inventors: Klaus Mullen, Mainz (DE); Andrew C. Grimsdale, Mainz (DE); Josemon Jacob, Mainz (DE)

(73) Assignee: Max-Plank-Society, Munich (DE)

( * ) Notice: Subject to any disclaimer, the term of this patent is extended or adjusted under 35 U.S.C. 154(b) by 349 days.

(21) Appl. No.: 10/696,058

(22) Filed: Oct. 29, 2003

(65) Prior Publication Data

US 2005/0092982 A1    May 5, 2005

(51) Int. Cl.
*H01L 51/00* (2006.01)
*C08G 61/10* (2006.01)
*C07C 49/617* (2006.01)
*H01L 51/54* (2006.01)
*C09K 11/06* (2006.01)

(52) U.S. Cl. .............. 257/40; 257/103; 257/E51.028; 257/E51.037; 257/E51.05; 528/8; 528/394; 528/397; 568/326; 568/332; 428/690; 428/917; 313/504; 526/280

(58) Field of Classification Search ........ 257/E51.037, 257/E51.05; 528/397
See application file for complete search history.

(56) References Cited

U.S. PATENT DOCUMENTS

| | | |
|---|---|---|
| 5,708,130 A | 1/1998 | Woo et al. |
| 5,777,070 A | 7/1998 | Inbasekaran et al. |
| 5,856,434 A * | 1/1999 | Stern et al. ............... 528/402 |
| 5,998,045 A | 12/1999 | Chen et al. |
| 6,169,163 B1 | 1/2001 | Woo et al. |
| 6,204,515 B1 | 3/2001 | Bernius et al. |
| 6,653,438 B1 | 11/2003 | Spreitzer et al. |
| 2002/0013451 A1 | 1/2002 | Huang et al. |
| 2002/0051895 A1 | 5/2002 | Cho et al. |

FOREIGN PATENT DOCUMENTS

| | | |
|---|---|---|
| DE | 198 46 767 A1 | 4/2000 |
| WO | WO 02/092724 A1 | 11/2002 |

* cited by examiner

*Primary Examiner*—Marie Yamnitzky
(74) *Attorney, Agent, or Firm*—John H. Lamming

(57) ABSTRACT

Novel pentaphenylenes having the following general formula are described;

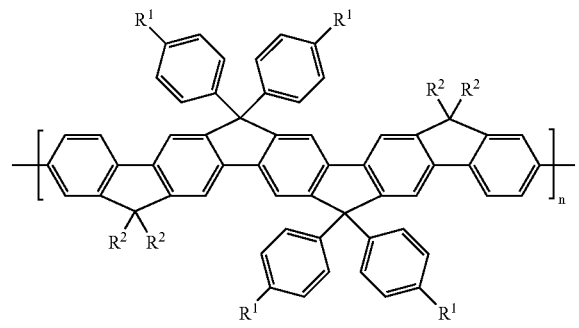

These polymers generally exhibit blue electroluminescence and are useful in electronic devices. A novel diketone compound having a low LUMO level of the following general structure is also described;

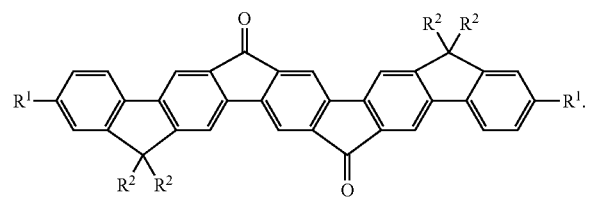

8 Claims, 3 Drawing Sheets

LIGHT-EMITTING POLYMERS AND ELECTRONIC DEVICES USING SUCH POLYMERS

FIELD OF THE INVENTION

The invention relates generally to pentaphenylene polymers, and their use in electronic devices.

BACKGROUND INFORMATION

Organic electronic devices are present in many different kinds of electronic equipment. In such devices, an active layer is sandwiched between two electrical contact layers. At least one of the electrical contact layers is light-transmitting so that light can pass through the electrical contact layer. One type of electronic device is an organic light emitting diode (OLED), which holds promise for display applications due to its high power conversion efficiency and low processing costs. Such displays are especially promising for battery-powered, portable electronic devices, including cellphones, personal digital assistants, handheld personal computers, and DVD players. These applications call for displays with high information content, full color, and fast video rate response time in addition to low power consumption.

OLED's typically contain electroluminescent (EL) layers arranged between an anode and a cathode. Types of electroluminescent materials which have been used in OLED's include fluorescent dyes, fluorescent and phosphorescent metal complexes, conjugated polymers, and mixtures thereof. Several classes of luminescent polymers have also been disclosed. These include, for example, poly(1,4-phenylene vinylene) and derivatives; polythiophenes, especially, poly(3-alkylthiophenes); and poly(p-phenylenes). Alkyl and dialkyl derivatives of polyfluorene have also been disclosed.

There is a continuing need for active compounds having the necessary efficiency and color. In particular, blue-emitting polymers are desirable.

SUMMARY OF THE INVENTION

The invention provides a polymer having the structure

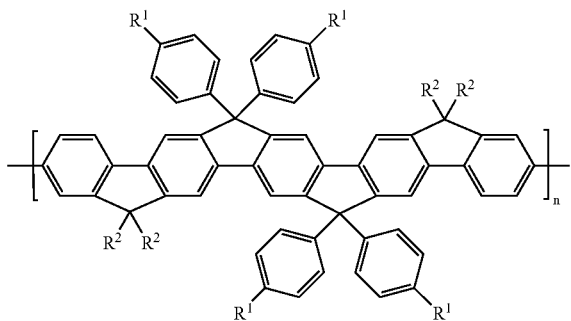

wherein:

$R^1$ is the same or different at each occurrence and is selected from hydrogen, $C_1$–$C_{20}$ alkyl, $C_2$–$C_{20}$ alkenyl, $C_2$–$C_{20}$ alkynyl, $C_1$–$C_{20}$ alkoxy, $C_1$–$C_{20}$ oxyalkyl, $C_2$–$C_{20}$ oxyalkenyl, $C_2$–$C_{20}$ oxyalkynyl, $C_1$–$C_{20}$ fluorinated alkyl, $C_2$–$C_{20}$ fluorinated alkenyl, $C_1$–$C_{20}$ fluorinated oxyalkyl, $C_2$–$C_{20}$ fluorinated oxyalkenyl, $C_2$–$C_{20}$ fluorinated oxyalkynyl, aryl, heteroalkyl, heteroalkenyl, heteroalkynyl, heteroaryl, —CN, —OR$^3$, —CO$_2$R$^3$, —SR$^3$, —N(R$^3$)$_2$, —P(R$^3$)$_2$, —SOR$^3$, —SO$_2$R$^3$, and —NO$_2$;

$R^2$ is the same or different at each occurrence and is selected from $C_1$–$C_{20}$ alkyl, $C_2$–$C_{20}$ alkenyl, $C_2$–$C_{20}$ alkynyl, $C_1$–$C_{20}$ alkoxy, $C_1$–$C_{20}$ oxyalkyl, $C_2$–$C_{20}$ oxyalkenyl, $C_2$–$C_{20}$ oxyalkynyl, $C_1$–$C_{20}$ fluorinated alkyl, $C_2$–$C_{20}$ fluorinated alkenyl, $C_1$–$C_{20}$ fluorinated oxyalkyl, $C_2$–$C_{20}$ fluorinated oxyalkenyl, $C_2$–$C_{20}$ fluorinated oxyalkynyl, heteroalkyl, heteroalkenyl, heteroalkynyl, —CN, —OR$^3$, —CO$_2$R$^3$, —SR$^3$, —N(R$^3$)$_2$, —P(R$^3$)$_2$, —SOR$^3$, —SO$_2$R$^3$, and —NO$_2$; or adjacent R$^2$ groups together can form a 5- or 6-membered cycloalkyl or heterocycloalkyl ring, and $R^3$ is a substituent on a heteroatom which can be the same or different at each occurrence and is selected from hydrogen, alkyl, aryl, heteroalkyl and heteroaryl; and n is greater than 2.

In one embodiment, the invention relates to an electronic device having an active layer comprising the above polymer.

In one embodiment, the invention relates to a compound having the structure:

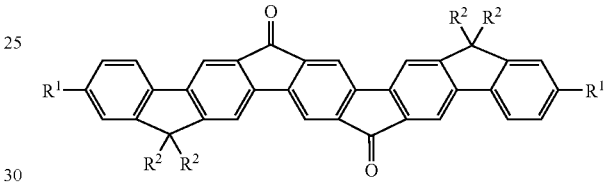

wherein $R^1$ and $R^2$ are as defined above

As used herein, the term "alkyl" refers to a monovalent straight or branched chain hydrocarbon group.

As used herein, "alkoxy" refers to the moiety —O-alkyl-, wherein alkyl is as defined above.

As used herein, "oxyalkyl" refers to alkyl moieties in which at least one —CH$_2$— unit of the alkyl moiety has been replaced by an oxygen atom.

As used herein, "alkenyl" refers to straight or branched chain hydrocarbyl groups having one or more carbon-carbon double bonds.

As used herein, "oxyalkenyl" refers to alkenyl moieties in which at least one —CH$_2$— unit of the alkenyl moiety has been replaced by an oxygen atom.

As used herein, "alkynyl" refers to straight or branched chain hydrocarbyl groups having one or more carbon-carbon triple bonds.

As used herein, "oxyalkynyl" refers to alkynyl moieties in which at least one —CH$_2$— unit of the alkynyl moiety has been replaced by an oxygen atom.

As used herein, "fluorinated" means that at least one hydrogen atom of the moiety has been replaced with a fluorine atom.

As used herein, the terms "heteroalkyl", "heteroalkenyl", and "heteroalkynyl" are intended to mean an alkyl group, an alkenyl group, and an alkynyl group, respectively, wherein one or more of the carbon atoms within the group has been replaced by another atom, such as nitrogen, oxygen, sulfur, and the like.

As used herein, the term "aryl" is intended to mean a group derived from an aromatic hydrocarbon which may be unsubstituted or substituted. The term "heteroaryl" in intended to mean an aryl group, wherein one or more of the carbon atoms within the aryl group has been replaced by another atom, such as nitrogen, oxygen, sulfur, and the like.

As used herein, the term "active material" is intended to mean a material which is electrically active or photoactive. Electrically active materials include conductive and semi-conductive materials. The term "photoactive" refers to any material that exhibits electroluminescence, photoluminescence, and/or photosensitivity.

As used herein, "blue," is intended to mean any color that appears bluish to the naked human eye, including light of wavelengths ranging from 400 nm to 540 nm.

As used herein, the term "emission maximum" is intended to mean the wavelength, in nanometers, at which the maximum intensity of electroluminescence is obtained. Electroluminescence is generally measured in a diode structure, in which the material to be tested is sandwiched between two electrical contact layers and a voltage is applied. The light intensity and wavelength can be measured, for example, by a photodiode and a spectrograph, respectively.

The IUPAC numbering system is used throughout, where the groups from the Periodic Table are numbered from left to right as 1–18 (CRC Handbook of Chemistry and Physics, 81$^{st}$ Edition, 2000).

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

BRIEF DESCRIPTION OF THE DRAWINGS

The invention is illustrated by way of example and not limitation in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION OF THE INVENTION

The polymer of the invention has a regular step-ladder structure consisting of planar ladder-type pentaphenylene units linked by single bonds which is designed to produce pure blue emission. This structure is intermediate between the fully ladder-type poly(p-phenylene) polymer ("LPPP") (reviewed by Scherf, *J. Mater. Chem.*, 1999, 9, 1853) and polyfluorenes (recent reviews are Neher, *Macromol. Rapid Commun.*, 2001, 22, 1365 and Scherf and List, *Adv. Mater.*, 2002, 14, 477) and is superior to both. LPPP polymers produce only unstable blue emission due to oxidation of bridgehead hydrogens. If modified by removing bridgehead hydrogens the emission, though stable, is blue-green. The polyfluorenes emit violet-blue light, and suffer problems of emission stability.

In the polymers of the invention the rigidity of the structure produces a small Stokes shift and high fluorescence efficiency. The aryl substituents improve the stability of the polymer against oxidation as previously shown in polyfluorenes (Müllen et al, *JACS*, 2001, 123, 946; *Adv. Mater.*, 2002, 13, 809), while the avoidance of polymer analogous reaction steps avoids defects due to incomplete ring closure as is possible in LPPP.

The polymers of the invention generally exhibit blue electroluminescence. In one embodiment, the emission maximum of the polymer is less than 500 nm. In one embodiment, the emission maximum is less than 450 nm.

In one embodiment of the polymer of the invention, n is greater than 10. In another embodiment, n is greater than 50.

In one embodiment of Formula I, $R^1$ is selected from $C_{1-20}$ alkyls. In one embodiment, $R^1$ is selected from $C_{1-10}$ alkyls. In one embodiment all $R^1$ groups are the same. In one embodiment $R^2$ is selected from $C_{1-20}$ alkyls. In one embodiment $R^2$ is selected from $C_{1-10}$ alkyls. In one embodiment all $R^2$ groups are the same.

The diketone of the invention has application as an electron acceptor for LED or photovoltaic applications.

Figure 1:
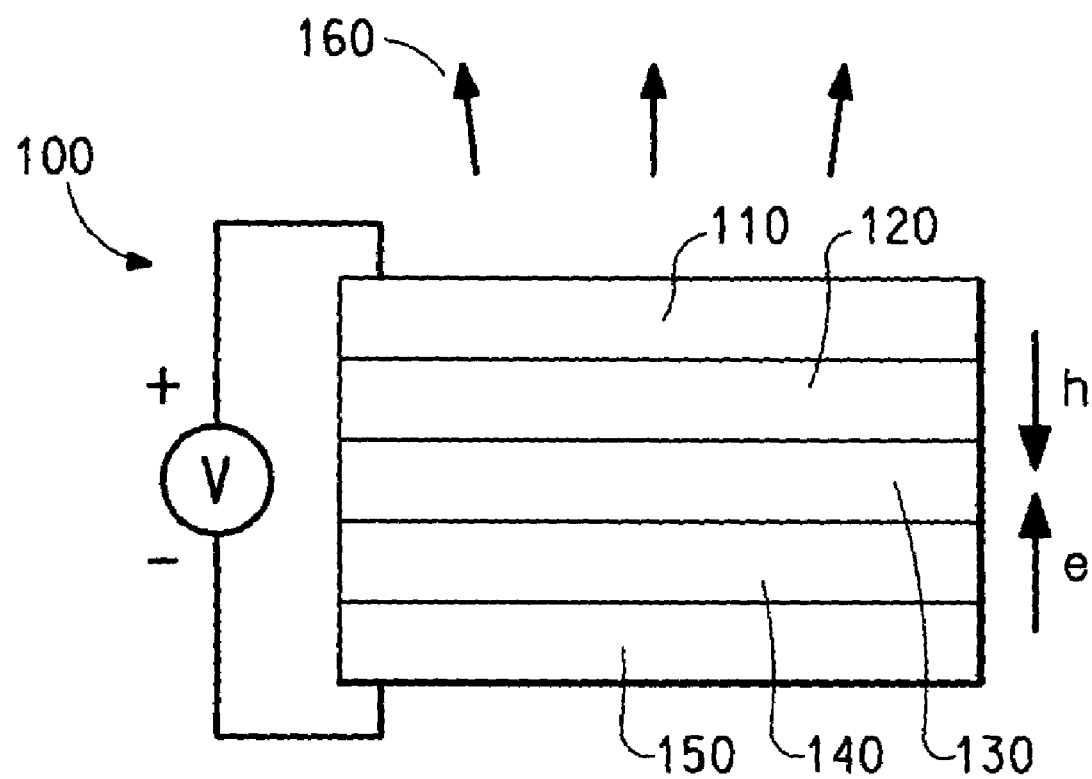
FIG. 1 includes an illustration of a cross-sectional view of an electronic device that includes a polymer in accordance with an embodiment of the present invention.

The polymers of the invention can be used in electronic devices. FIG. 1 illustrates an exemplary electronic device 100 that includes an active layer positioned between two electrical contact layers. The electronic device 100 includes a hole transport layer 120 located between the active layer 130 and an anode layer 110. An optional electron transport layer 140 is located between the active layer 130 and a cathode layer 150. Depending on the application of the device 100, the active layer 130 can be a light-emitting layer that is activated by an applied voltage (such as in a light-emitting diode or light-emitting electrochemical cell), a layer of material that responds to radiant energy and generates a signal with or without an applied bias voltage (such as in a photodetector). Examples of photodetectors include photoconductive cells, photoresistors, photoswitches, phototransistors, phototubes, and photovoltaic cells, as described in Markus, John, *Electronics and Nucleonics Dictionary*, 470 and 476 (McGraw-Hill, Inc., 1966). The device is not limited with respect to system, driving method, and utility mode. The polymers may be used as part of an organic active layer, hole-transport layer, or electron-transport layer in an organic light-emitting diode ("OLED") of a display. When used in OLEDs, some of the best device performances to date including high efficiency and blue color purity have been achieved.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed-metal oxide. Suitable metals include the Group 11 metals, the metals in Groups 4, 5, and 6, and the Group 8–10 transition metals. If the anode layer 110 is to be light transmitting, mixed-metal oxides of Groups 12, 13 and 14 metals, such as indium-tin-oxide, may be used. Some non-limiting, specific examples of materials for anode layer 110 include indium-tin-oxide ("ITO"), aluminum-tin-oxide, gold, silver, copper, nickel, and selenium. The anode may also comprise an organic material such as polyaniline.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as e-beam evaporation and resistance evaporation. Specific forms of physical vapor deposition include rf magnetron sputtering or inductively-coupled plasma physical vapor deposition ("IMP-PVD"). These deposition techniques are well known within the semiconductor fabrication arts.

Examples of materials which may facilitate hole-injection/transport comprise N,N'-diphenyl-N,N'-bis(3-methylphenyl)-[1,1'-biphenyl]-4,4'-diamine (TPD) and bis[4-(N,N-diethylamino)-2-methylphenyl](4-methylphenyl) methane (MPMP); hole-transport polymers such as polyvinylcarbazole (PVK), (phenylmethyl)polysilane, poly (3,4-ethylenedioxythiophene) (PEDOT), and polyaniline (PANI), or the like; electron and hole-transporting materials such as 4,4'-N,N'-dicarbazole biphenyl (BCP); or light-emitting materials with good hole-transport properties. In some embodiments, if the conductivity of the hole-injection/transport layer 120 can be made similar to anode layer 110, the anode layer 110 may not be required and the hole-injection/transport layer 120 can act as the anode for the electronic device.

The hole-injection/transport layer 120 can be formed using any conventional means, including spin-coating, casting, and printing, such as gravure printing. The layer can also be applied by ink jet printing, thermal patterning, or chemical or physical vapor deposition.

Usually, the anode layer 110 and the hole-injection/transport layer 120 are patterned during the same lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 and hole-injection/transport layer 120 typically are formed into substantially parallel strips having lengths that extend in substantially the same direction.

The polymers of the invention have particular utility in the active layer 130. This layer can be applied from solutions by any conventional technique, including spin-coating, casting, and printing.

Optional layer 140 can function both to facilitate electron-injection/transport, and also serve as a buffer layer or confinement layer to prevent quenching reactions at layer interfaces. More specifically, layer 140 may promote electron mobility and reduce the likelihood of a quenching reaction if layers 130 and 150 would otherwise be in direct contact.

Examples of materials which may facilitate electron-injection/transport comprise metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, $Li_2O$, or the like.

The electron-injection/transport layer 140 can be formed using any conventional means, including spin-coating, casting, and printing. The layer can also be applied by ink jet printing, thermal patterning, or chemical or physical vapor deposition.

The cathode layer 150 is an electrode that is particularly efficient for injecting electrons or negative charge carriers. The cathode layer 150 can be any metal or nonmetal having a lower work function than the first electrical contact layer (in this case, the anode layer 110). Materials for the second electrical contact layer can be selected from alkali metals of Group 1 (e.g., Li, Na, K, Rb, Cs,), the Group 2 (alkaline earth) metals, the Group 12 metals, the rare earths, the lanthanides (e.g., Ce, Sm, Eu, or the like), and the actinides. Materials such as aluminum, indium, calcium, barium, yttrium, and magnesium, and combinations, may also be used. Specific non-limiting examples of materials for the cathode layer 150 include barium, lithium, cerium, cesium, europium, rubidium, yttrium, magnesium, and samarium.

The cathode layer 150 is usually formed by a chemical or physical vapor deposition process. In general, the cathode layer will be patterned, as discussed above in reference to the anode layer 110 and optional conductive polymer layer 120. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the conductive polymer layer 120 and the active layer 130 may facilitate positive charge transport, band-gap matching of the layers, function as a protective layer, or the like. Similarly, additional layers (not shown) between the active layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the conductive polymer layer 120, the active layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

Although not meant to limit, the different layers may have the following range of thicknesses: inorganic anode layer 110, usually no greater than approximately 500 nm, for example, approximately 10–200 nm; conductive polymer layer 120, usually no greater than approximately 250 nm, for example, approximately 20–200 nm; active layer 130, usually no greater than approximately 1000 nm, for example, approximately 10–80 nm; optional layer 140, usually no greater than approximately 100 nm, for example, approximately 20–80 nm; and cathode layer 150, usually no greater than approximately 1000 nm, for example, approximately 30–500 nm. If the anode layer 110 or the cathode layer 150 needs to transmit at least some light, the thickness of such layer may not exceed approximately 100 nm. In polymer light emitting diodes, electrons and holes, injected from the cathode 150 and anode 110 layers, respectively into the active polymer layer 130, form negative and positively charged polarons in the polymer. These polarons migrate under the influence of the applied electric field, forming a polaron exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

The invention will now be described in greater detail by reference to the following non-limiting examples.

EXAMPLES

Example 1

As shown in the scheme below, Suzuki coupling of the fluorene-2-boronate ester 1, with the dibromoterephthalate 2 generated an intermediate, the pentaphenylenediester 3 in 92% yield. Addition of an excess of 4-alkylphenyl lithium produced a diol which was facilely ring-closed using $BF_3$ etherate to generate the ladder-type pentaphenylene 4 (95%). Bromination of 4 using $CuBr_2$ on alumina gave the monomer 5 (91%). The polymer 6 was synthesized by a nickel(0) mediated Yamamoto type polymerisation. GPC analysis using PPP (polyparaphenylene) standards showed a number-averaged molecular mass ($M_n$) of $1.36 \times 10^5$, corresponding to a degree of polymerisation of about 83, with a polydispersity of 2.19.

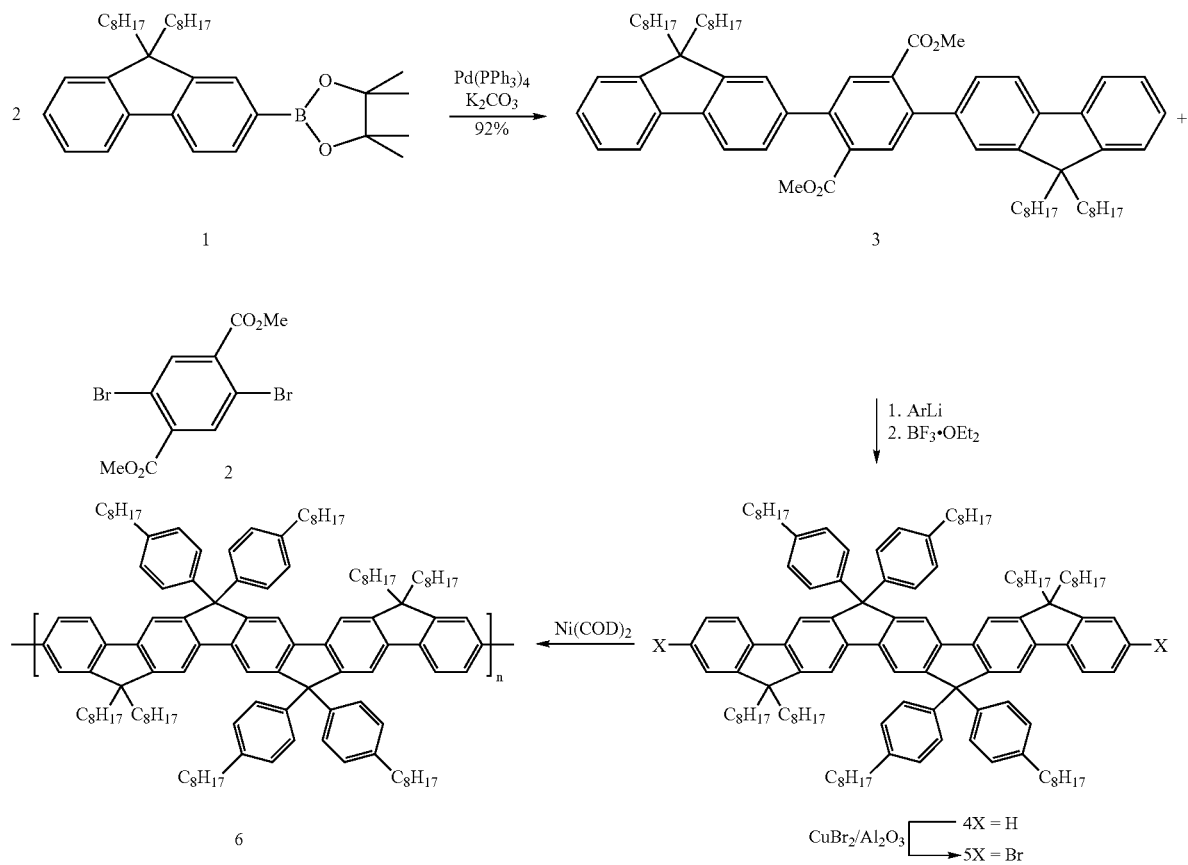

Synthesis of the Pentaphenylene Diester 3

The boronate ester 1 (4.65 g, 9.0 mmol), diester 2 (1.52 g, 4.39 mmol), $K_2CO_3$ (1.21 g, 8.8 mmol) were dissolved in THF (40 mL) and water (20 mL) in a 100 mL schlenk flask. The solution was purged with argon for twenty minutes and then tetrakis(triphenylphosphine)palladium (152 mg, 0.03 equiv) was added and the reaction was heated with stirring at 85° C. The reaction was followed by TLC and after 16 h was worked up. The cooled mixture was extracted with diethyl ether, and the extract was washed with saturated salt and then dried over $MgSO_4$. The crude product so obtained was purified by chromatography on silica using 0–5% ethylacetate in hexane as eluent. The product 3 was isolated as a thick viscous oil (3.94 g, 92%). $^1$H NMR: ($CD_2Cl_2$): δ 7.88 (s, 2H) 7.78 (m, 4H) 7.40–7.33 (m, 10H) 3.65 (s, 6H) 2.00 (t, 8H, J=8.5 Hz) 1.21–1.07 (m, 40H) 0.62.0.83 (m, 20H) ppm. $^{13}$C NMR: δ 169.26, 151.74, 151.62, 141.89, 141.56, 141.43, 139.54, 134.37, 132.44, 128.02, 127.82, 127.59, 123.84, 123.73, 120.55, 120.29, 55.96, 52.78, 41.16, 32.54, 30.81, 30.05, 29.99, 24.56, 23.35, 14.58 ppm. FDMS: m/z 971.3 Elemental Analysis: Calculated C, 84.07; H, 9.34; Found C, 84.12; H, 9.32.

Synthesis of the Ladder-Type Pentaphenylene 4 a) A solution of 4-octylbromobenzene (3.05 mL, 3.4 g, 12.6 mmol) in dry THF (40 mL) in a 250 mL schlenk flask, was cooled to −78° C. in an acetone/dry ice bath. n-Butyl-lithium in hexane (8.0 mL, 1.6 M, 12.8 mmol) was then added and stirred for 20 minutes. Then a solution of the diester 3 (2.05 g, 2.1 mmol) in dry THF (40 mL) was added dropwise with stirring and the solution was slowly allowed to warm to room temperature. The mixture was stirred overnight and then the quenched with brine. The mixture was extracted with diethyl ether, and the extract was washed with salt and dried over $MgSO_4$. The crude product was chromatographed on silica using 0–5% ethylacetate in hexane as eluent to give the diol as a thick viscous oil. (3.39 g, 96%). $^1$H NMR: δ 7.61 (m, 2H) 7.45 (d, 2H, J=7.6 Hz) 7.29 (m, 6H) 7.12 (m, 16H) 6.76 (m, 4H) 6.69 (s, 2H) 3.11 (s, 2H) 2.61 (t, 8H, J=7.6 Hz) 1.77–0.45 (m, 128H) ppm. $^{13}$C NMR: δ 151.63, 151.23, 146.41, 144.19, 142.74, 141.71, 141.21, 141.05, 139.29, 136.29, 129.29, 128.76, 128.58, 127.93, 127.48, 124.32, 123.63, 120.35, 120.22, 83.91, 55.75, 40.55, 36.30, 32.72, 32.60, 32.45, 30.73, 30.30, 30.12, 30.09, 30.07, 30.04, 24.56, 23.46, 23.39, 14.65, 14.61 ppm. FDMS: m/z 1668.3.

b) ring-closure: The diol (3.30 g, 1.98 mmol) was dissolved in dichloromethane (30 mL, used as purchased) and $BF_3$ etherate (0.20 mL) was added with stirring at room temperature. The colorless solution turned deep brown immediately upon addition and became light yellow within minutes. After 10 minutes, methanol (50 mL) was added to the solution whereupon the pentamer 4 started to precipitate as a colourless solid. The mixture was stirred for 12 h and then the solid was collected by filtration, washed with methanol and dried. The product was redissolved in dichloromethane and precipitated again by addition of methanol. Isolated yield of 4=3.06 g (95%). $^1$H NMR: δ 7.83 (s, 2H) 7.63 (m, 6H) 7.33–7.11 (m, 22H) 2.58 (t, 8H, J=7.6 Hz) 2.02/t, 3H, J=7.9 Hz) 1.63–0.62 (m, 120H) ppm. $^{13}$C NMR: δ 152.80, 152.05, 151.88, 151.55, 144.35, 142.29, 141.83, 140.91, 140.87, 140.25, 129.11, 128.97, 127.63, 127.37, 123.65, 120.34, 118.16, 117.82, 115.35, 65.15, 55.61, 41.39, 36.28, 32.65, 32.55, 32.30, 30.82, 30.30, 30.22, 30.03, 30.01, 29.98, 24.67, 23.43, 23.34, 14.64, 14.60 ppm. FDMS: m/z 1633.2. Elemental Analysis: Calculated C, 89.75; H, 10.25%; Found: C, 89.77; H, 10.19%.

Synthesis of Monomer 5

The pentaphenylene 4 (0.80 g, 0.49 mmol) was added to carbon tetrachloride (30 mL) in a 100 mL round-bottomed flask, followed by $CuBr_2$ on alumina (2.0 g).[23] The reaction was heated under reflux with stirring and monitored by FDMS, which showed nearly quantitative formation of the dibromide after 14 h. The reaction mixture was concentrated, and the residue was loaded on silica and chromatographed on silica using hexane as eluent. The product 5 was isolated as a light yellow solid, (0.80 g, 91%). $^1$H NMR: δ 7.82 (s, 2H) 7.66 (d, 4H, J=9.1 Hz) 7.42 (m, 6H) 7.24 (d, 8H, J=8.2 Hz) 7.12 (d, 8H, J=8.2 Hz) 2.58 (t, 8H, J=7.3 Hz) 2.00 (t, 8H, J=7.6 Hz) 1.59 (m, 8H) 1.31–0.78 (m, 112H) ppm. $^{13}$C NMR: δ 154.19, 152.90, 152.30, 151.23, 144.17, 142.38, 140.97, 140.85, 140.76, 140.69, 130.52, 129.14, 128.95, 126.92, 121.79, 121.51, 118.29, 117.97, 115.44, 65.17, 55.99, 41.28, 36.26, 32.65, 32.53, 32.29, 30.73, 30.69, 30.29, 30.22, 30.00, 29.97, 24.62, 23.43, 23.35, 14.64, 14.60 ppm. FDMS: m/z 1780.50. Elemental Analysis: Calculated C, 81.84; H, 9.23%; Found: 81.99; H, 9.24%.

Synthesis of Poly(pentaphenylene) 6

Bis(cyclooctadiene)nickel (215.0 mg, 2.4 equiv) cyclooctadiene (96 µL, 2.4 equiv), and 2,2'-bipyridine (122.3 mg, 2.4 equiv) were dissolved in dry toluene (4 mL) and dry N,N-dimethylformamide (4 mL) in a schlenk flask within a glove box. The mixture was heated at 60° C. with stirring under argon for 20 min to generate the catalyst and then a solution of the dibromide 5 (584 mg, 0.33 mmol) in dry toluene (8 mL) was added. The reaction was heated at 75° C. for two days whereupon the solution became so viscous that it ceased to stir. Then a mixture of toluene (4 mL) and bromobenzene (0.10 mL) was added and the mixture was heated at 75° C. for an additional 12 h. The mixture was then poured into a mixture of methanol and concentrated hydrochloric acid (1:1, 300 mL) and stirred for 4 h. The precipitated yellow solid was redissolved in THF (40 mL) and added dropwise to methanol (200 mL). The resulting solid was filtered off and subjected to soxhlet extraction for two days in acetone. The residue was then redissolved in THF and precipitated again from methanol, filtered, washed with methanol and dried. Isolated yield of 6=508 mg (96%). GPC analysis: $M_n=1.36\times10^5$, $M_w=2.98\times10^5$, D=2.19 (against PPP standard) and $M_n=2.64\times10^5$, $M_w=7.37\times10^5$, D=2.79 (against PS standard).

Example 2

LEDs were prepared with configuration ITO/PEDOT:PSS/6/Ca/Al. The best devices showed blue emission (CIE coordinates x=0.17, y=0.09) with a luminance of over 200 cd/m$^2$ which was stable during several minutes operation at 6–7 V (j=78 mA) in a glovebox. Best results were obtained from devices with an emissive layer of 50 nm.

Figure 2:
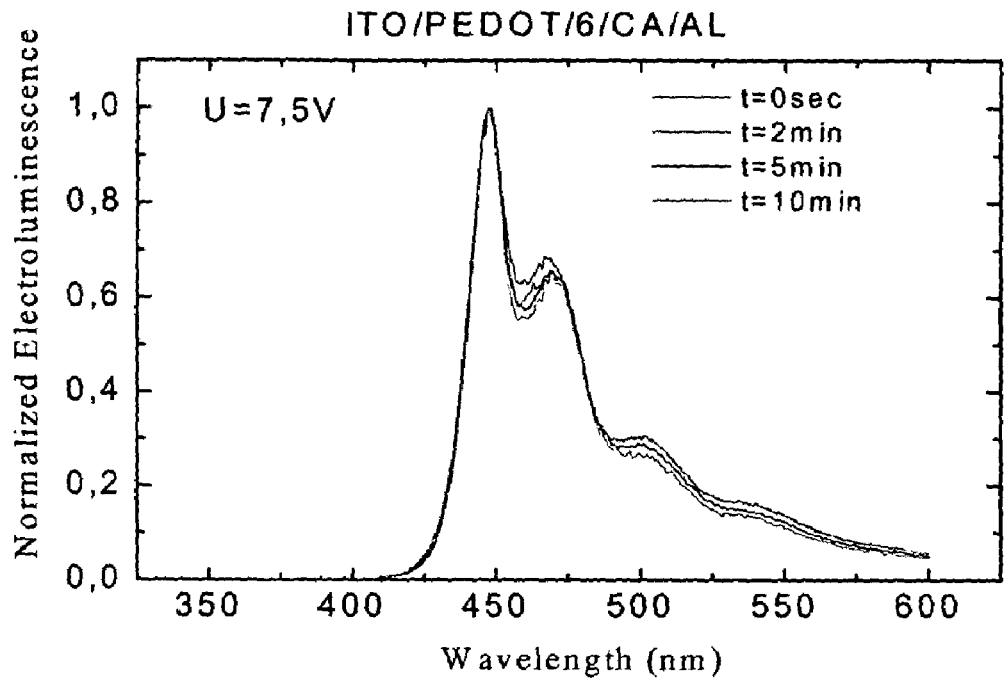
FIG. 2 shows the electroluminescence spectrum of a polymer of the invention.

The electroluminescence spectra from ITO/PEDOT:PSS/6/Ca/Al at different times, are shown in FIG. 2.

Figure 3:
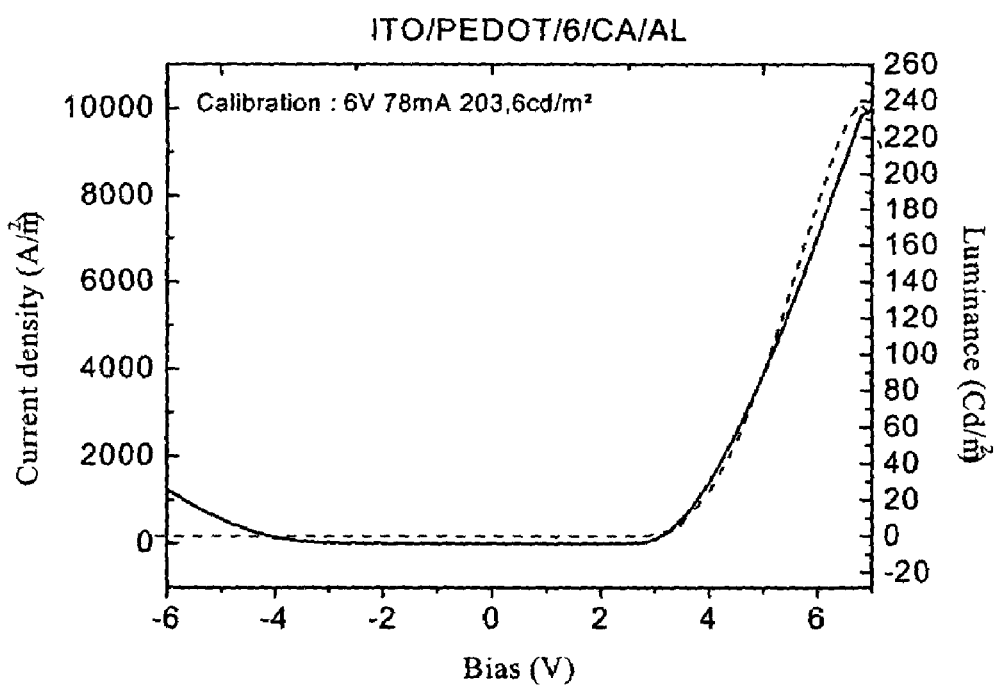
FIG. 3 is a plot of luminance and current density versus bias for an electronic device containing a polymer of the invention.

The luminance and current density from ITO/PEDOT:PSS/6/Ca/Al are shown in FIG. 3.

Example 3

The reaction sequence to prepare a diketone compound of the invention is outlined below. 2,7-Dibromo-9,9-dioctylfluorene 7 was converted via the monosilyl compound to the boronate 8. Suzuki coupling of this with the terephthalate 2 gave a crude disilylpentaphenylene in 86% yield, which was converted to the dibromide 9 with sodium acetate and bromine (72%). The monomers 5 could then be obtained by addition of aryllithium and ring closure, but in view of the longer synthesis and lower overall yield, this route is inferior to the previously described route. Treatment of 9 with concentrated sulphuric acid at 165° C. induced a double intramolecular Friedel-Crafts acylation to produce the desired diketone 10 in 65% yield. By contrast treatment of the unbrominated diester 3 under the same condition gave incomplete ring closure. Treatment of 10 with an excess of benzeneboronic acid under Suzuki coupling conditions gave the model compound 11.

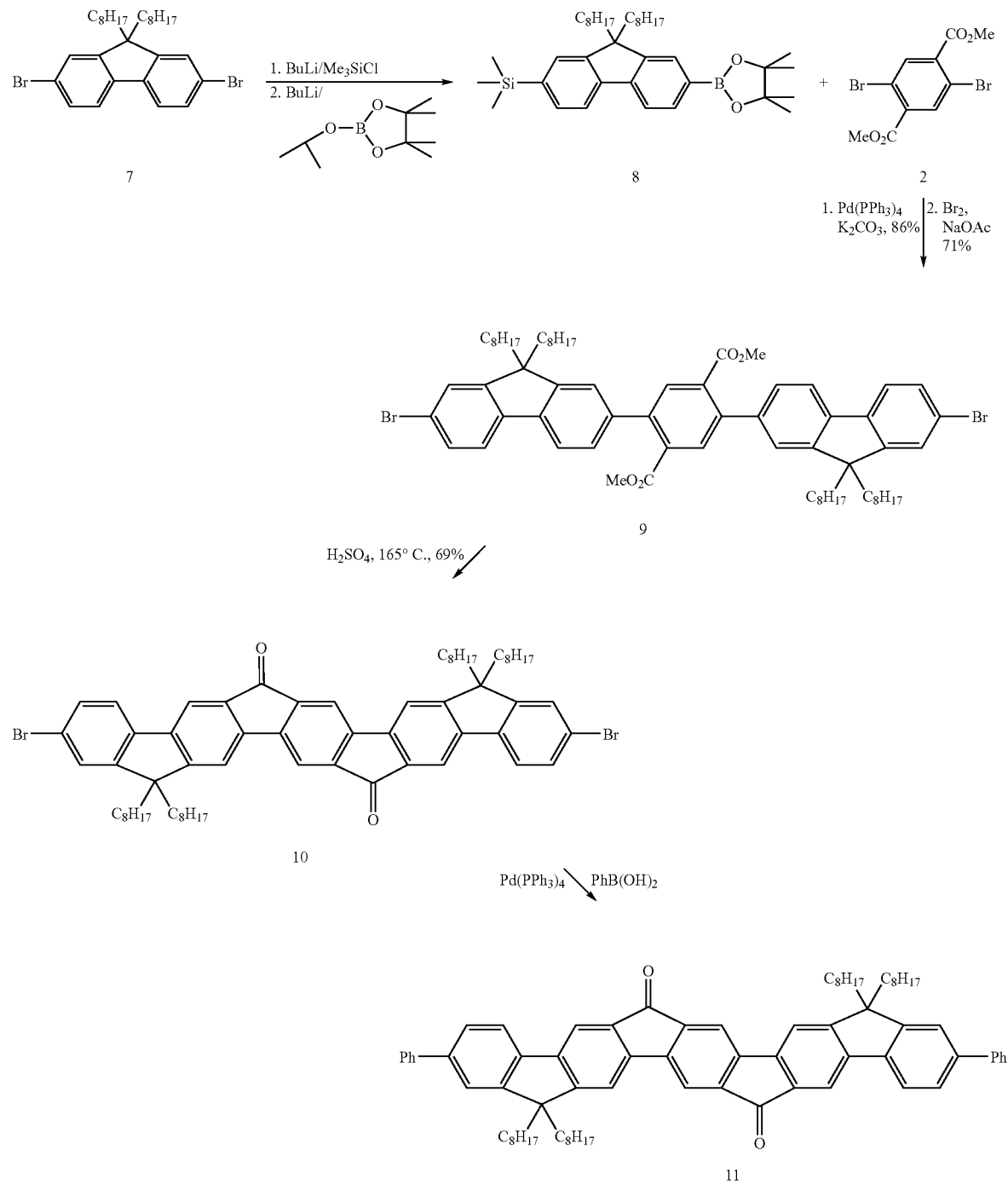

Synthesis of 7-trimethylsilyl-9,9-di-n-octylfluorene-2-boronate 8 n-Butyllithium in hexane (6.0 mL, 1.6 M, 9.6 mmol) was added to a solution of 2,7-dibromo-9,9-di-n-octylfluorene (7) (5.00 g, 9.13 mmol) in dry THF (50 mL) in a schlenk flask at −78° C. and the mixture was stirred for 20 minutes. Then chlorotrimethylsilane (1.5 mL, 1.29 g, 1.3 equiv) was added and the reaction was allowed to slowly warm to room temperature. The mixture was stirred overnight and the reaction was quenched with saturated brine. The product was extracted into diethyl ether, and the extract was washed with brine and dried over $MgSO_4$. The crude product was chromatographed on silica using hexane as eluent to give 2-bromo-7-trimethylsilyl-9,9-di-n-octylfluorene as a colourless oil, (3.50 g, 71%). n-Butyllithium in hexane (4.4 mL, 1.6 M, mmol) was added to a solution of 2-bromo-7-trimethylsilyl-9,9-di-n-octylfluorene (3.47 g, 6.41 mmol) in dry THF (75 mL) in a schlenk flask at −78° C., and the mixture was stirred for 20 minutes. 2-Isopropoxy-4,4,5,5-tetramethyl-1,3,2-dioxaborolane (1.44 mL, 1.31 g, 7.04 mmol) was added and the reaction was stirred for 24 h after warming to room temperature. The reaction was then quenched with brine, and the product was extracted into diethyl ether. The extract was washed with brine and dried over $MgSO_4$. The crude product was chromatographed on silica using 0–3% ethylacetate in hexane as eluent, to give 8 as a colourless solid (2.67 g, 71%). $^1H$ NMR ($CD_2Cl_2$): δ 7.73 (m, 4H) 7.51 (m, 2H) 1.99 (t, 4H, J=8.2 Hz) 1.36–0.54 (m, 42H) 0.31 (s, 9H) ppm. $^{13}C$ NMR: δ 151.60, 151.34, 149.76, 145.29, 142.69, 141.07, 134.71, 133.01, 130.08, 129.03, 120.50, 120.25, 84.93, 56.22, 41.26, 33.01, 32.84, 31.11, 30.37, 25.98, 24.95, 23.85, 15.08, 0.01. FDMS m/z 588.90.

Synthesis of Dibromopentaphenylene 9

The boronate ester 8 (2.45 g, 4.16 mmol), the diester 2 (697 mg, 1.98 mmol), and $K_2CO_3$ (821 mg) were dissolved in a mixture of THF (20 mL) and $H_2O$ (10 mL) in a schlenk flask and the mixture was purged with argon for 20 minutes. To this tetrakis(triphenylphosphine)palladium (114 mg, 0.05 equiv) was added and the mixture was heated at 85° C. for 20 h. The cooled mixture was extracted with diethyl ether, and the extract was washed with brine and dried over $MgSO_4$. The residue was chromatographed on silica using 0–3% ethylacetate in hexane to give the crude disilylpentaphenylene (1.89 g, 86%).

In a schlenk flask, the reaction product (1.89 g, 1.69 mmol) was added to dry THF (34 mL) along with anhydrous sodium acetate (278 mg, 2 equiv) and cooled to 0° C. Bromine (0.37 mL, 1.15 g, 4.2 equiv) was added and the mixture was stirred for 20 minutes. The reaction was quenched by addition of triethylamine (1.89 mL, 8 equiv) followed by an excess of aqueous $Na_2SO_3$. The product was extracted into diethyl ether, and the extract was washed with sodium sulfite solution and dried over $MgSO_4$. The residue was recrystallized from hot hexane to give the dibromide 9 as shiny colourless crystals (1.37 g, 72%). $^1H$ NMR ($CD_2Cl_2$): δ 7.87 (s, 2H) 7.77 (d, 2H, J=7.9 Hz) 7.64 (d, 2H, J=7.9 Hz) 7.53–7.31 (m, 8H) 3.64 (s, 6H) 1.99 (t, 8H, J=8.8 Hz) 1.27–0.62 (m, 60H) ppm. $^{13}C$ NMR: δ 169.06, 154.06, 151.27, 141.89, 140.58, 140.49, 140.05, 134.32, 132.51, 130.76, 128.06, 127.04, 123.87, 122.01, 121.96, 120.46, 56.36, 52.82, 41.08, 32.54, 30.74, 30.03, 29.99, 24.52, 23.36, 14.59 ppm. FDMS m/z 1129.30 Elemental Analysis: Calculated C, 72.33; H, 7.85%; Found C, 72.75; H, 7.91%.

Synthesis of Dibromopentaphenylenedione 10

The dibromide 9 (1.37 g) was added to 40 mL of 80% $H_2SO_4$ (made from 4 mL $H_2O$ and 36 mL conc. $H_2SO_4$) and heated with stirring at 165° C. for 3 h during which time the white solid turned brown. The acid was decanted off and the product was extracted into dichloromethane, and the extract was washed with sodium hydrogencarbonate solution and dried over $MgSO_4$. The crude product was purified by chromatography on silica using 0–3% ethylacetate in hexane as eluent to give the diketone 10 as a grey solid(0.88 g, 69%). $^1H$ NMR ($CD_2Cl_2$): δ 7.97 (s, 2H) 7.86 (s, 2H) 7.65–7.49 (m, 8H) 2.03 (t, 8H, J=8.5 Hz) 1.25–0.62 (m, 60H) ppm. $^{13}C$ NMR: δ 192.91, 159.79, 153.77, 146.79, 144.19, 142.53, 140.81, 139.69, 134.70, 131.11, 127.10, 122.66, 122.21, 116.50, 116.38, 116.27, 56.96, 40.88, 32.53, 30.66, 29.97, 29.95, 24.60, 23.37, 14.60 ppm. Elemental Analysis: Calculated C, 74.42; H, 7.57%; Found C, 74.63; H, 7.60%.

Synthesis of 11

The diketone 10 (127.0 mg, 0.12 mmol) phenylboronic acid (36.5 mg, 0.30 mmol), $K_2CO_3$ (33 mg, 0.24 mmol) tetrahydrofuran (6.0 mL) water (3.0 mL) were mixed in a schlenk flask which was purged with argon for 15 minutes. Tetrakis(triphenylphosphine)palladium (5.5 mg, 5.0 μmmol) was added and and the mixture was heated with stirring for 14 hours at 85° C. The product was extracted into ether, and the extract was washed with saturated brine and dried over $MgSO_4$. The residue was chromatographed on silica using 0–4% ethylacetate in hexane as eluent to recover 11 as a grey solid (91.0 mg, 72%). $^1H$ NMR: δ 8.02 (s, 2H) 7.86 (s, 2H) 7.83 (d, 2H, J=7.9 Hz) 7.71–7.62 (m, 10H) 7.49 (t, 4H, J=6.9 Hz) 7.37 (t, 2H, J=7.2 Hz) 2.11 (t, 8H, J=8.4 Hz) 1.18–1.07 (m, 40H) 0.80–0.71 (m, 20H) ppm. FDMS m/z 1059.0.

Example 4

Figure 4:
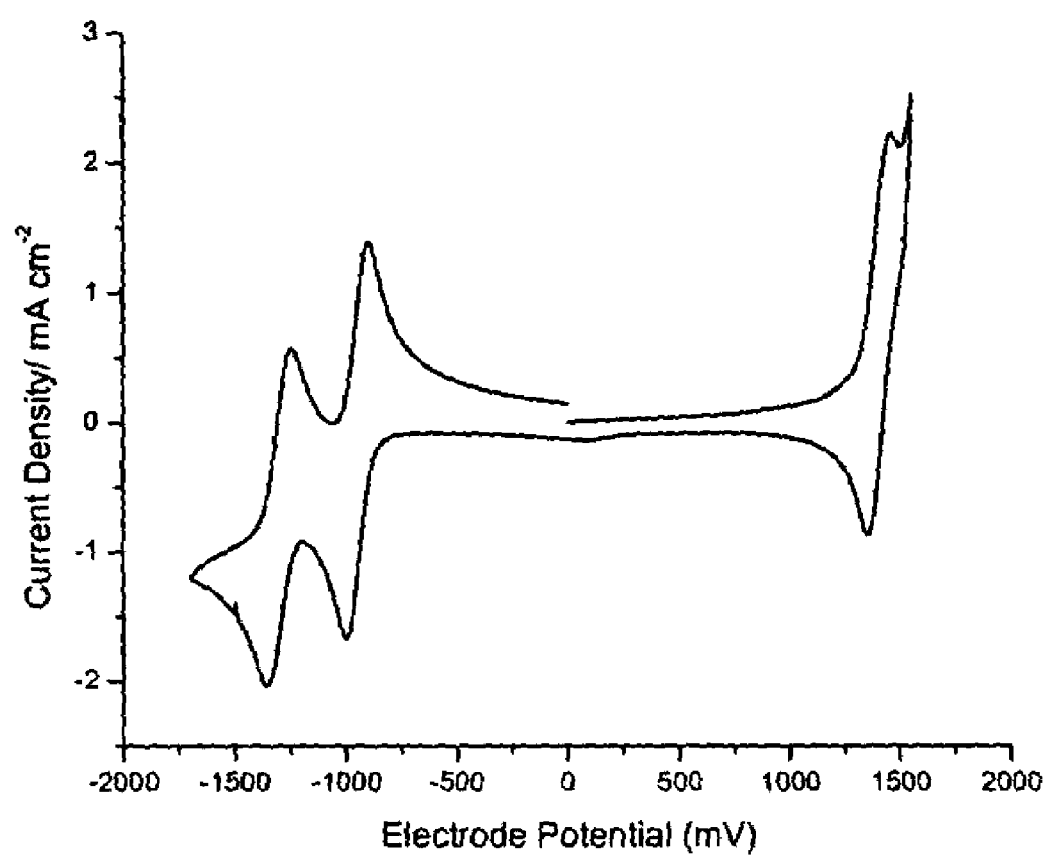
FIG. 4 is a plot showing cyclic voltammetry measurements for a diketone compound of the invention.

Cyclic voltammetry was performed on 11 against Ag/AgCl with a ferrocene/ferrocenium internal standard. The results are shown in FIG. 4. The diketone showed fully reversible p- and n-doping, with two reduction peaks at −1.0 V and −1.35 V, which are assigned to the reduction of the diketone to a quinonoidal dianion, and an oxidation peak at 1.46 V. The onsets for reduction and oxidation occurred at −0.875 V and 1.31 V, from which we estimate the LUMO and HOMO energy levels to be 3.53 eV and 5.71 eV respectively, given an energy level of 4.4 eV for Ag/AgCl. The estimated LUMO energy means that there should be small barriers to injection of electrons into materials containing this unit from relatively air-stable metals such as magnesium (work function 3.7 eV) or aluminium (4.2 eV), thus obviating the need to use unstable low work function metals such as calcium as cathodes. The low LUMO also makes this an attractive candidate as the electron acceptor in photovoltaic devices.

Comparative Examples

Step-ladder type paraphenylenes have been made as shown below by Scherf, Müllen and coworkers (Müllen, Scherf et al, *Acta Polym.*, 1994, 45, 244; Müllen, Scherf et al, 1999, U.S. Pat. No. 5,856,434).

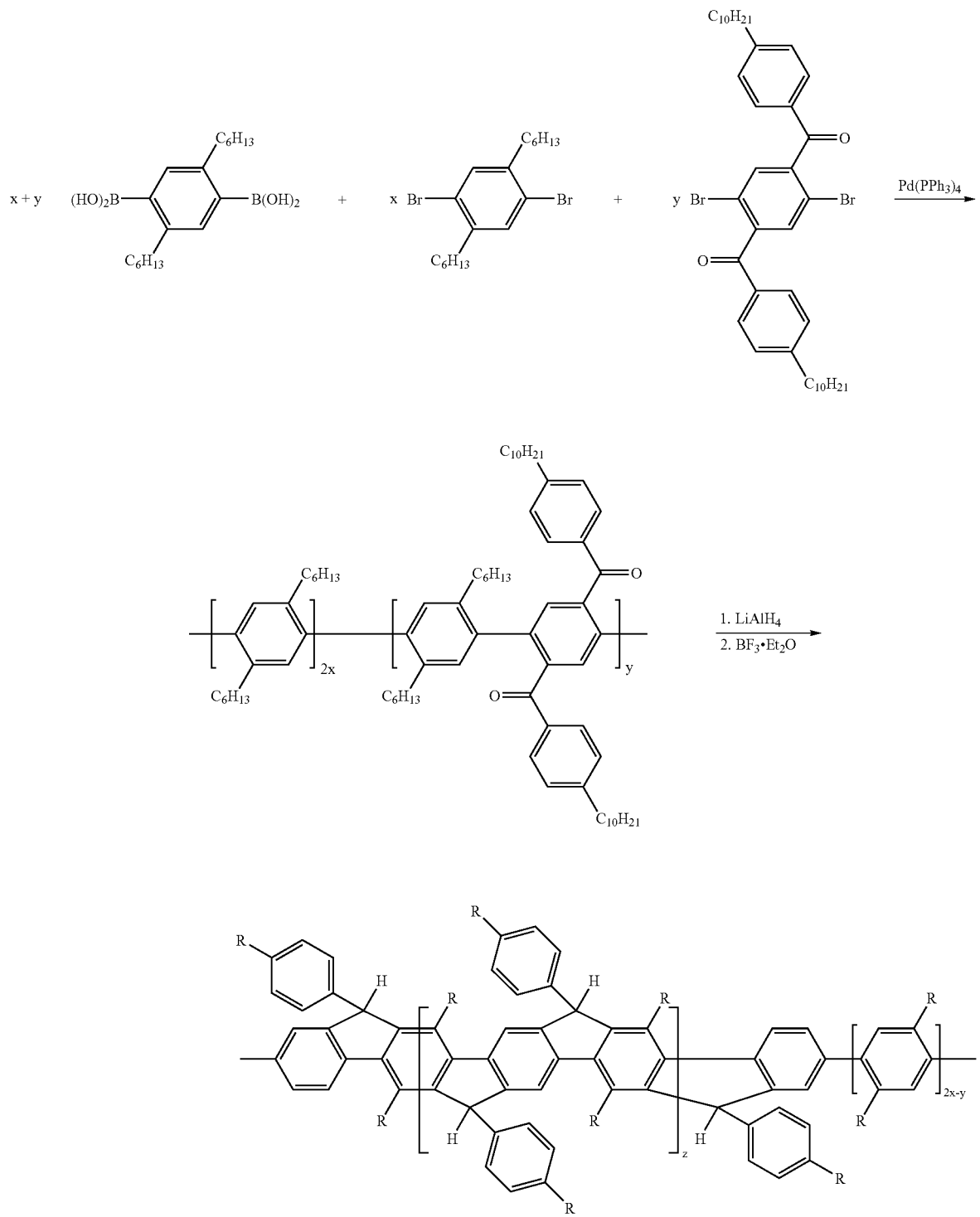

These show relatively stable light blue EL, but with some yellow component (Scherf et al, *Adv. Mater.*, 1994, 6, 748; Müllen, Scherf et al, 1999, U.S. Pat. No. 5,856,434), and the bridgehead hydrogens make them susceptible to oxidation. Charge transporting components have been incorporated to improve the EL efficiency (Scherf et al, *Chem Phys. Lett.*, 1996, 251, 304; Müllen, Scherf et al, 1999, U.S. Pat. No. 5,856,434).

Pentaphenylenes similar to the monomer 5 from Example 1, have been made by the groups of Scherf (Scherf et al, *Adv. Mater.*, 1995, 7, 292) and Advincula (Xia and Advincula, *Macromolecules*, 2001, 34, 6922.), as shown below.

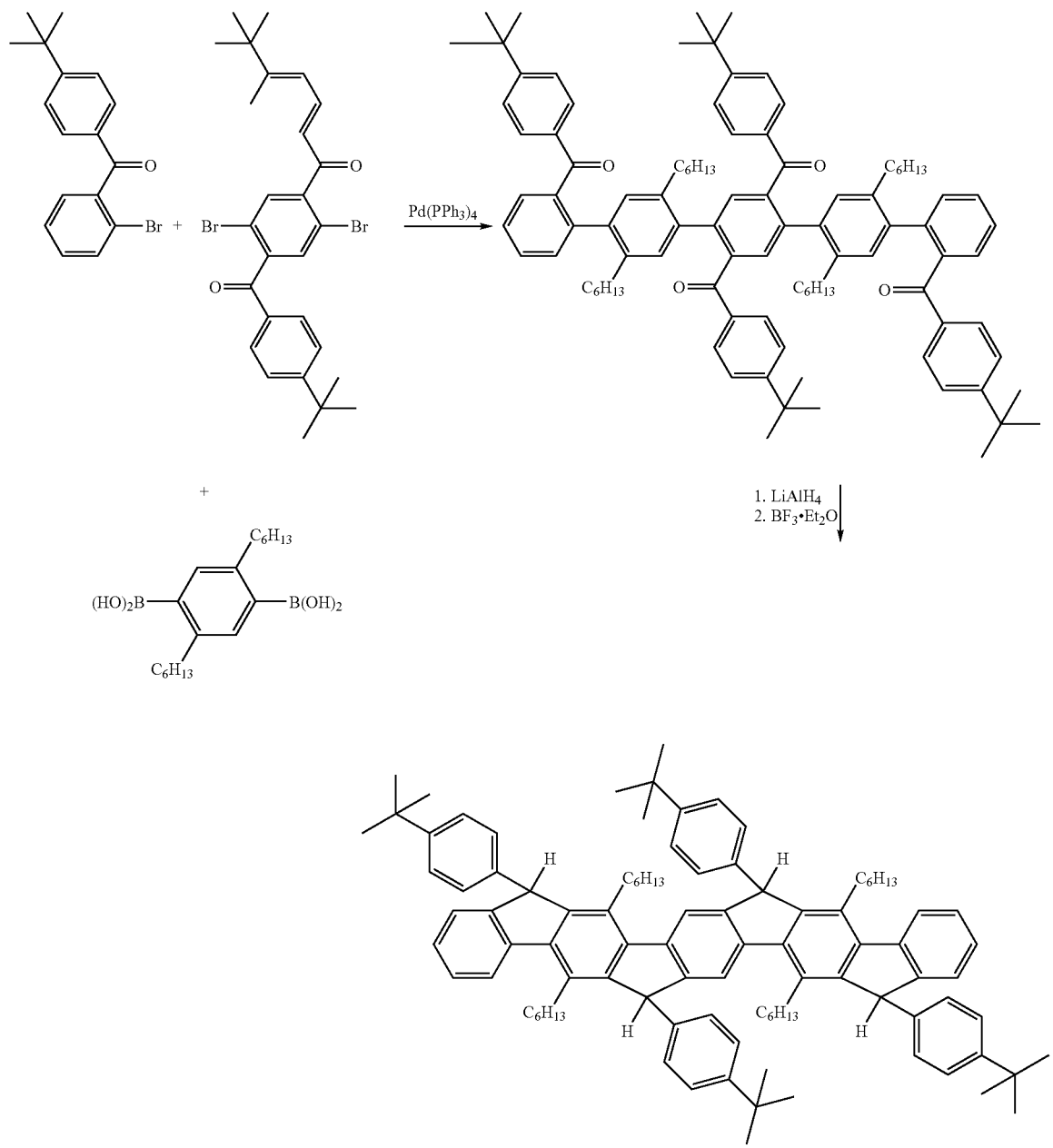
Scherf et al, Adv. Mater, 1995, 7, 292
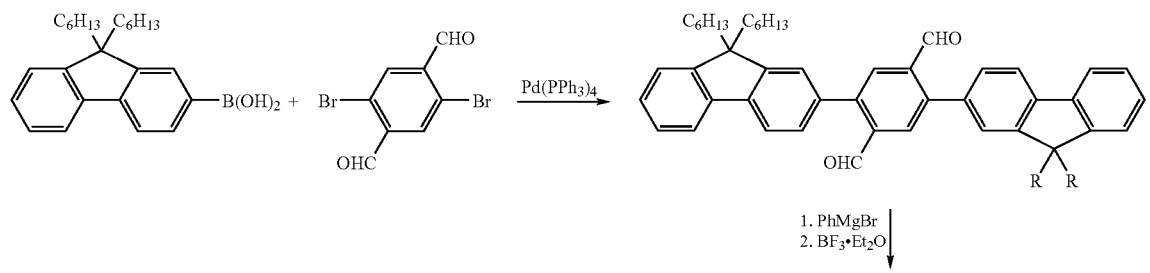

-continued

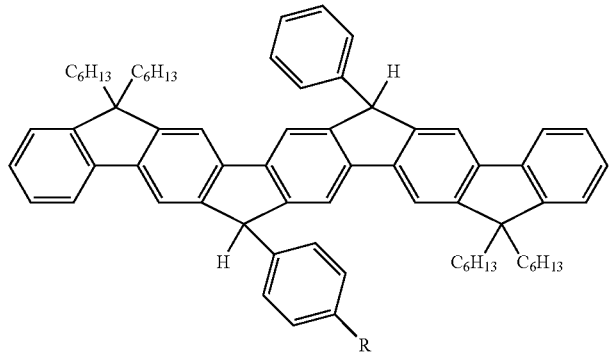

Xia and Advincula, Macromolecules, 2001, 34, 6922.

The Scherf route requires separation of a mixture of oligomers from a Suzuki coupling involving a mono-bromo endcapping reagent, followed by ring closure of the isolated pentaphenylene. The Advincula route is closely analogous to the synthesis of 5. These pentaphenylenes show PL maxima at 397, 415 nm in solution, and at 434, 461 nm in solid state. By contrast the polymer 6 shows no red shift in going from solution to solid state. The bridgehead hydrogens in these oligomers make them susceptible to oxidation, which will produce red-shifts in their emission.

What is claimed is:

1. A polymer having the structure:

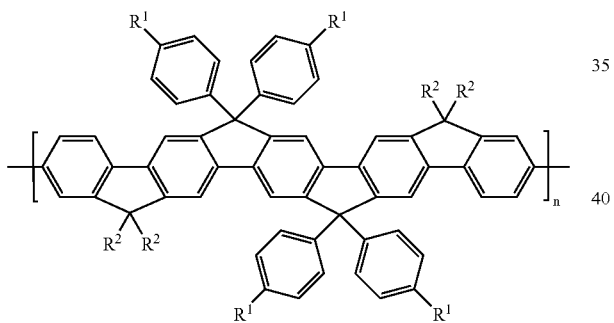

wherein:
$R^1$ is the same or different at each occurrence and is selected from hydrogen, $C_1$–$C_{20}$ alkyl, $C_2$–$C_{20}$ alkenyl, $C_2$–$C_{20}$ alkynyl, $C_1$–$C_{20}$ alkoxy, $C_1$–$C_{20}$ oxyalkyl, $C_2$–$C_{20}$ oxyalkenyl, $C_2$–$C_{20}$ oxyalkynyl, $C_1$–$C_{20}$ fluorinated alkyl, $C_2$–$C_{20}$ fluorinated alkenyl, $C_1$–$C_{20}$ fluorinated oxyalkyl, $C_2$–$C_{20}$ fluorinated oxyalkenyl, $C_2$–$C_{20}$ fluorinated oxyalkynyl, aryl, heteroalkyl, heteroalkenyl, heteroalkynyl, heteroaryl, —CN, —OR$^3$, —CO$_2$R$^3$, —SR$^3$, —N(R$^3$)$_2$, —P(R$^3$)$_2$, —SOR$^3$, —SO$_2$R$^3$, and —NO$_2$;

$R^2$ is the same or different at each occurrence and is selected from $C_1$–$C_{20}$ alkyl, $C_2$–$C_{20}$ alkenyl, $C_2$–$C_{20}$ alkynyl, $C_1$–$C_{20}$ alkoxy, $C_1$–$C_{20}$ oxyalkyl, $C_2$–$C_{20}$ oxyalkenyl, $C_2$–$C_{20}$ oxyalkynyl, $C_1$–$C_{20}$ fluorinated alkyl, $C_2$–$C_{20}$ fluorinated alkenyl, $C_1$–$C_{20}$ fluorinated oxyalkyl, $C_2$–$C_{20}$ fluorinated oxyalkenyl, $C_2$–$C_{20}$ fluorinated oxyalkynyl, heteroalkyl, heteroalkenyl, heteroalkynyl, —CN, —OR$^3$, —CO$_2$R$^3$, —SR$^3$, —N(R$^3$)$_2$, —P(R$^3$)$_2$, —SOR$^3$, —SO$_2$R$^3$, and —NO$_2$; or adjacent $R^2$ groups together can form a 5- or 6-membered cycloalkyl or heterocycloalkyl ring, and $R^3$ is a substituent on a heteroatom which can be the same or different at each occurrence and is selected from hydrogen, alkyl, aryl, heteroalkyl and heteroaryl;
n is greater than 2.

2. A polymer according to claim 1, wherein n is greater than 10.

3. A polymer according to claim 1, wherein $R^1$ is a $C_1$–$C_{20}$ alkyl.

4. A polymer according to claim 1, wherein $R^2$ is a $C_1$–$C_{20}$ alkyl.

5. A polymer according to claim 1, wherein the polymer has an emission maximum less than 500 nm, and wherein the emission maximum is a wavelength at which maximum intensity of electroluminescence is obtained in a diode structure.

6. An electronic device comprising an active layer positioned between two electrical contact layers, wherein the active layer comprises a polymer having the structure:

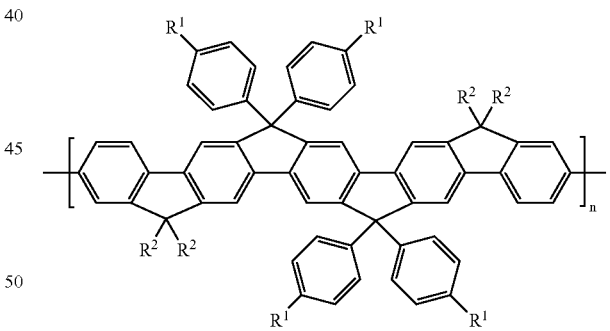

wherein:
$R^1$ is the same or different at each occurrence and is selected from hydrogen, $C_1$–$C_{20}$ alkyl, $C_2$–$C_{20}$ alkenyl, $C_2$–$C_{20}$ alkynyl, $C_1$–$C_{20}$ alkoxy, $C_1$–$C_{20}$ oxyalkyl, $C_2$–$C_{20}$ oxyalkenyl, $C_2$–$C_{20}$ oxyalkynyl, $C_1$–$C_{20}$ fluorinated alkyl, $C_2$–$C_{20}$ fluorinated alkenyl, $C_1$–$C_{20}$ fluorinated oxyalkyl, $C_2$–$C_{20}$ fluorinated oxyalkenyl, $C_2$–$C_{20}$ fluorinated oxyalkynyl, aryl, heteroalkyl, heteroalkenyl, heteroalkynyl, heteroaryl, —CN, —OR$^3$, —CO$_2$R$^3$, —SR$^3$, —N(R$^3$)$_2$, —P(R$^3$)$_2$, —SOR$^3$, —SO$_2$R$^3$, and —NO$_2$;

$R^2$ is the same or different at each occurrence and is selected from $C_1$–$C_{20}$ alkyl, $C_2$–$C_{20}$ alkenyl, $C_2$–$C_{20}$ alkynyl, $C_1$–$C_{20}$ alkoxy, $C_1$–$C_{20}$ oxyalkyl, $C_2$–$C_{20}$ oxyalkenyl, $C_2$–$C_{20}$ oxyalkynyl, $C_1$–$C_{20}$ fluorinated alkyl, $C_2$–$C_{20}$ fluorinated alkenyl, $C_1$–$C_{20}$ fluorinated oxyalkyl, $C_2$–$C_{20}$ fluorinated oxyalkenyl, $C_2$–$C_{20}$ fluorinated oxyalkynyl, heteroalkyl, heteroalkenyl, heteroalkynyl, —CN, —OR$^3$, —CO$_2$R$^3$, —SR$^3$, —N(R$^3$)$_2$, —P(R$^3$)$_2$, —SOR$^3$, —SO$_2$R$^3$, and —NO$_2$; or adjacent R$^2$ groups together can form a 5- or 6-membered cycloalkyl or heterocycloalkyl ring, and R$^3$ is a substituent on a heteroatom which can be the same or different at each occurrence and is selected from hydrogen, alkyl, aryl, heteroalkyl and heteroaryl; and n is greater than 2.

7. An electronic device according to claim 6, wherein the device emits light having an emission maximum at a wavelength less than 500 nm.

8. A compound having the structure:

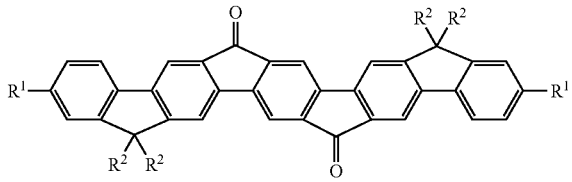

R$^1$ is the same or different at each occurrence and is selected from hydrogen, $C_1$–$C_{20}$ alkyl, $C_2$–$C_{20}$ alkenyl, $C_2$–$C_{20}$ alkynyl, $C_1$–$C_{20}$ alkoxy, $C_1$–$C_{20}$ oxyalkyl, $C_2$–$C_{20}$ oxyalkenyl, $C_2$–$C_{20}$ oxyalkynyl, $C_1$–$C_{20}$ fluorinated alkyl, $C_2$–$C_{20}$ fluorinated alkenyl, $C_1$–$C_{20}$ fluorinated oxyalkyl, $C_2$–$C_{20}$ fluorinated oxyalkenyl, $C_2$–$C_{20}$ fluorinated oxyalkynyl, aryl, heteroalkyl, heteroalkenyl, heteroalkynyl, heteroaryl, —CN, —OR$^3$, —CO$_2$R$^3$, —SR$^3$, —N(R$^3$)$_2$, —P(R$^3$)$_2$, —SOR$^3$, —SO$_2$R$^3$, and —NO$_2$;

R$^2$ is the same or different at each occurrence and is selected from $C_1$–$C_{20}$ alkyl, $C_2$–$C_{20}$ alkenyl, $C_2$–$C_{20}$ alkynyl, $C_1$–$C_{20}$ alkoxy, $C_1$–$C_{20}$ oxyalkyl, $C_2$–$C_{20}$ oxyalkenyl, $C_2$–$C_{20}$ oxyalkynyl, $C_1$–$C_{20}$ fluorinated alkyl, $C_2$–$C_{20}$ fluorinated alkenyl, $C_1$–$C_{20}$ fluorinated oxyalkyl, $C_2$–$C_{20}$ fluorinated oxyalkenyl, $C_2$–$C_{20}$ fluorinated oxyalkynyl, heteroalkyl, heteroalkenyl, heteroalkynyl, —CN, —OR$^3$, —CO$_2$R$^3$, —SR$^3$, —N(R$^3$)$_2$, —P(R$^3$)$_2$, —SOR$^3$, —SO$_2$R$^3$, and —NO$_2$; or adjacent R$^2$ groups together can form a 5- or 6-membered cycloalkyl or heterocycloalkyl ring, and R$^3$ is a substituent on a heteroatom which can be the same or different at each occurrence and is selected from hydrogen, alkyl, aryl, heteroalkyl and heteroaryl.

\* \* \* \* \*